(12) United States Patent
Chen et al.

(10) Patent No.: US 6,743,655 B2
(45) Date of Patent: Jun. 1, 2004

(54) NEGATIVE DIFFERENTIAL RESISTANCE REOXIDIZED NITRIDE SILICON-BASED PHOTODIODE AND METHOD

(75) Inventors: Fen Chen, Williston, VT (US); Roger Aime Dufresne, Fairfax, VT (US); Baozhen Li, Burlington, VT (US); Alvin Wayne Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/205,527

(22) Filed: Jul. 25, 2002

(65) Prior Publication Data

US 2002/0185703 A1 Dec. 12, 2002

Related U.S. Application Data

(62) Division of application No. 09/665,913, filed on Sep. 20, 2000, now Pat. No. 6,445,021.

(51) Int. Cl.⁷ ................................................. H01L 21/00
(52) U.S. Cl. ............................................ 438/59; 438/57
(58) Field of Search ............ 438/56–380; 257/225–228, 257/233, 251

(56) References Cited

U.S. PATENT DOCUMENTS

| | | | |
|---|---|---|---|
| 3,903,542 A | 9/1975 | Nathanson et al. | |
| 4,127,932 A | 12/1978 | Hartman et al. | |
| 4,148,052 A | 4/1979 | Nathanson et al. | |
| 4,534,099 A | 8/1985 | Howe | |
| 4,692,995 A | 9/1987 | Blanchard | |
| 4,742,027 A | 5/1988 | Blanchard et al. | |
| 5,241,198 A | 8/1993 | Okada et al. | |
| 5,302,545 A | 4/1994 | Okada et al. | |
| 5,404,373 A * | 4/1995 | Cheng | 372/50 |
| 5,654,565 A * | 8/1997 | Hokari | 257/222 |
| 5,663,608 A * | 9/1997 | Jones et al. | 313/309 |
| 5,895,227 A * | 4/1999 | Itatani et al. | 438/69 |
| 6,026,108 A * | 2/2000 | Lim et al. | 372/50 |
| 6,348,720 B1 * | 2/2002 | Okada | 257/437 |
| 2001/0015907 A1 * | 8/2001 | Noble | 365/159 |

OTHER PUBLICATIONS

Wu, et al., "Nitridation Induced Surface Donor Layer in Silicon and its Impact on the Characteristics of n–and p–channel MOSFET's", Electron Devices Meeting, 1989, Technical Digest, International, pp. 271–274, (1989).

* cited by examiner

Primary Examiner—Chandra Chaudhari
Assistant Examiner—William Vesperman
(74) Attorney, Agent, or Firm—Scully, Scott, Murphy & Presser; William H. Steinberg

(57) ABSTRACT

A photodiode that exhibits a photo-induced negative differential resistance region upon biasing and illumination is described. The photodiode includes an N+ silicon substrate, a silicon nitride layer formed on the N+ silicon substrate, a reoxidized nitride layer formed on the silicon nitride layer and a N+ polysilicon layer formed on at least a portion of the reoxidized nitride layer.

8 Claims, 2 Drawing Sheets

NEGATIVE DIFFERENTIAL RESISTANCE REOXIDIZED NITRIDE SILICON-BASED PHOTODIODE AND METHOD

RELATED APPLICATIONS

This application is a divisional application of U.S. application Ser. No. 09/665,913, filed on Sep. 20, 2000, now U.S. Pat. No. 6,445,021.

FIELD OF THE INVENTION

The present invention relates to a method of fabricating a photodiode and the photodiode produced therefrom. Specifically, the present invention is directed to a method of forming a photodiode wherein a layer of N+ polysilicon is formed over a dielectric multilayer of silicon nitride/reoxidized nitride, the silicon nitride layer of the multilayer having been formed on an N+ silicon substrate. A characteristic feature of the inventive photodiode is that on exposure to light photons and, while biasing the N+ silicon substrate positively with respect to the N+ polysilicon layer, the photodiode exhibits negative differential resistance (NDR).

BACKGROUND OF THE INVENTION

Silicon-based electronic components dominate integrated circuits (IC's) largely due to a mature and successful silicon processing technology. However, as the technology advances, and as the need for smaller, faster components increases, it is becoming increasingly desirable to combine silicon-based electronic components with silicon-based opto-electronic components to produce opto-electronic integrated circuits (OEIC's) utilizing existing silicon processing technology.

In OEIC technology, opto-electronic components such as photodiodes characterized by negative differential resistance (NDR) regions are of great interest as they offer a potential for high-speed, high-density and less complex OEIC's. NDR refers to the rate of change of current through a photodiode as the voltage changes across the diode, upon exposing the photodiode to light.

With their high switching speed and intrinsic binary on-off state, these photodiodes, when combined with other silicon-based electronic devices, potentially will provide highly compact, ultra-fast and low-cost OEIC's.

Although silicon-based photodiodes are known; see, for example, U.S. Pat. Nos. 4,148,052; 5,241,198; 4,742,027 and 4,534,099, a silicon-based photodiode utilizing a silicon nitride/reoxidized nitride dielectric that demonstrates NDR is not known.

Accordingly, in view of the potential advantages of such photodiodes with NDR characteristics for OIEC's, it is desirable to provide a photodiode which includes a silicon nitride/reoxidized nitride dielectric utilizing existing silicon-based processing technology.

SUMMARY OF THE INVENTION

One object of the present invention is to provide a photodiode that exhibits NDR characteristics.

Another object of the present invention is to provide a photodiode which includes a silicon nitride/reoxidized nitride dielectric.

A further object of the present invention is to provide a photodiode having the above characteristics utilizing existing silicon processing technology.

Specifically, and in one aspect of the present invention, a photodiode is provided that includes at least:

an N+ silicon substrate;

a layer of silicon nitride formed on said N+ silicon substrate;

a layer of, oxidized silicon nitride formed on said silicon nitride layer; and a layer of N+ polysilicon formed on at least a portion of said oxidized silicon nitride layer, said photodiode exhibiting a negative differential resistance region upon biasing said N+ silicon substrate positively with respect to said N+ polysilicon layer and exposing said photodiode to illumination.

The present invention also provides a method of fabricating a photodiode with NDR characteristics, comprising the stops of:

(a) forming a silicon nitride layer on an N+ silicon substrate;

(b) forming an oxidized silicon nitride layer on said silicon nitride layer; and (c) forming a layer of N+ polysilicon on at least a portion of said oxidized silicon nitride layer so as to produce a photodiode, wherein said photodiode exhibits a negative differential resistance region upon biasing said N+ silicon substrate positively with respect to said N+ polysilicon layer and exposing said photodiode to illumination.

Throughout the remaining text, the term "reoxidized layer" is used to denote the oxidized silicon nitride layer. The term "reoxidized layer" is used herein to distinguish the inventive method, oxidiation of SiN, from conventional oxidation of silicon surfaces.

The present invention also provides an OEIC apparatus which includes at least the photodiode of the present invention as one of components of the OEIC apparatus.

DETAILED DESCRIPTION OF THE INVENTION

Figure 1:
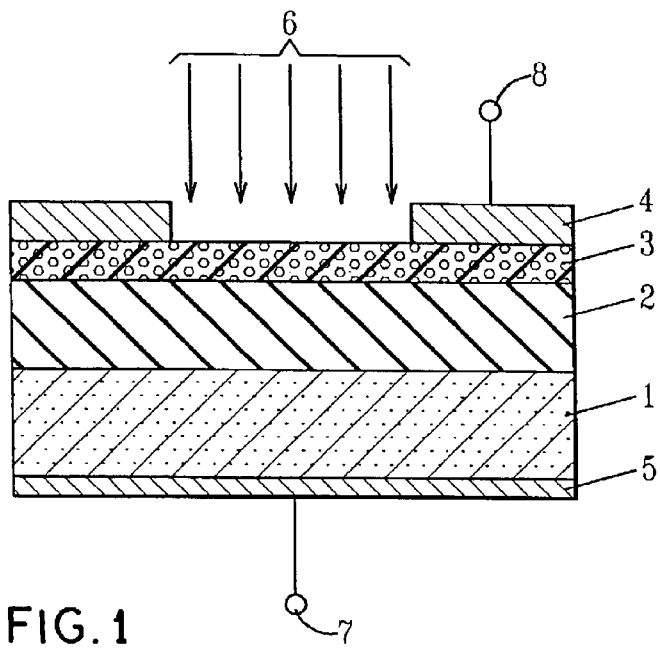
FIG. 1 illustrates a cross-section schematic of the photodiode of the present invention.

The present invention which is directed to a photodiode having NDR characteristics and a method of fabricating the same will now be described in more detail by referring to the drawings that accompany the present application.

Reference is first made to FIG. 1 which illustrates a schematic cross-section, not to scale, of the present photodiode. As illustrated, the photodiode comprises N+ silicon substrate 1, a layer of silicon nitride 2 formed on N+ silicon substrate 1, a layer of reoxidized nitride 3 formed on silicon nitride layer 2, and a layer of N+ polysilicon 4 formed on a portion of said reoxidized nitride layer 3. Supporting the N+ silicon substrate layer 1 is an Ohmic contact 5 that also serves as an electrode for positively biasing the N+ silicon substrate layer 1 with respect to the N+ polysilicon layer. Alternatively, the bias configuration could be negative on the N+ polysilicon layer.

In the inventive photodiode illustrated in FIG. 1, silicon nitride layer 2 has a thickness of less than about 5 nm and the reoxidized nitride 3 formed thereon has a thickness of from about 1 to 2 nm. As discussed below and with regard to FIGS. 2 and 3, on exposing the silicon nitride/reoxidized nitride layer 3 to photons 6, and on biasing the photodiode at electrodes 7, 8 the photodiode exhibits NDR characteristics. In FIG. 1, electrode 7 should always be biased with higher potential than electrode 8 in order to obtain NDR. Thus, electrode 7 may be positively biased and electrode 8 may be grounded or negatively biased, or alternatively, electrode 7 may be grounded and electrode 8 is negatively biased.

Also with reference to FIG. 1, the method of the invention is described. As a first step, a silicon substrate is doped to form N+ silicon substrate 1. This step, as is well known in the art, includes preparing a semiconductor substrate suitable for integrated circuit fabrication and doping the substrate by well known doping techniques such as by out diffusion from an N-type doped glass material or ion implantation utilizing an N-type dopant such as arsenic or phosphorus, to form the N+ silicon substrate. Alternatively, one could use a N+ substrate which requires no doping.

Optionally, and prior to forming the silicon nitride layer on the N+ silicon substrate, the substrate may be precleaned using a conventional Huang-type precleaning process.

Next, a layer of silicon nitride (SiN) 2 is formed on N+ silicion substrate 1 by nitriding the surface of the silicon substrate by techniques well known in the art. That is, silicon nitride layer may be formed, for example, by thermally growing a silicon nitride film on the substrate using a conventional in-situ growing process which includes:

(i) removing any native oxide from the N+ silicon substrate by prebaking at a temperature of about 950° C. for about 30 minutes in the presence of a reducing atmosphere, e.g., $H_2$;

(ii) heating the N+ silicon substrate of step (i) in $NH_3$ at a temperature of about 950° C. to form a SiN nucleation layer having a thickness of from about 20 to about 25 Å on the N+ silicon substrate; and (iii) depositing a SiN layer on said SiN nucleation layer by low pressure chemical vapor deposition (LPCVD) using dichlorosilane and $NH_3$ as reactant gases. The LPCVD step, i.e., step (iii), which is typically conducted at a temperature of from about 650° to about 750° C., serves to grow the bulk of the SiN layer on the N+ substrate.

The layer of silicon nitride formed using the above processing steps typically has a thickness of about 5 nm. Other thicknesses for the silicon nitride layer as well as the other layers of the inventive photodiode besides those mentioned herein are also possible.

Next, a reoxidized nitride layer 3 is formed on silicon nitride 2, using techniques well known in the art. For example, this reoxidized nitride layer is formed by exposing nitride layer 2 to steam or another wet ambient at a temperature of about 900° C. The reoxidized layer formed from this reoxidization step typically has a thickness of from about 1 to about 2 nm.

A layer of N+ polysilicon partially or entirely covering the reoxidized nitride layer is thereafter formed on the reoxidized nitride layer. A partial N+ polysilicon layer is preferred herein since it provides better signal. As in the previous steps, the N+ polysilicon layer is formed by techniques well known in the art including optionally using a masking layer to define the portion of the reoxidized layer not to be covered and using an in-situ doping deposition process to form the N+ polysilicon layer on the reoxidized nitride layer. Alternatively, the N+ polysilicon layer may be formed by deposition and ion implantation. The N+ polysilicon layer formed in this step of the present invention typically has a thickness of about 3000 Å.

Figure 2:
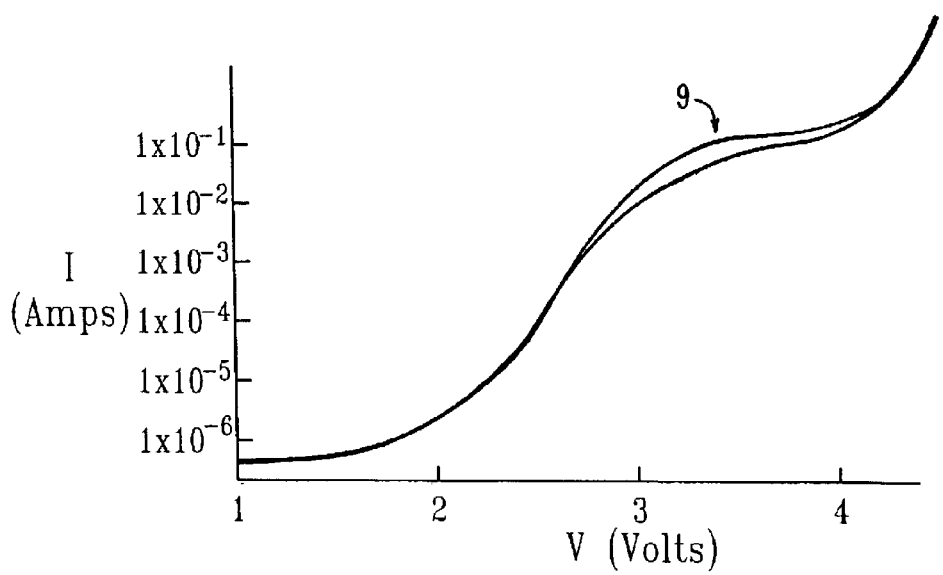
FIG. 2 is a graph of current (I) vs. voltage (V) characteristics of the photodiode of the present invention at two different light intensities.
Figure 3:
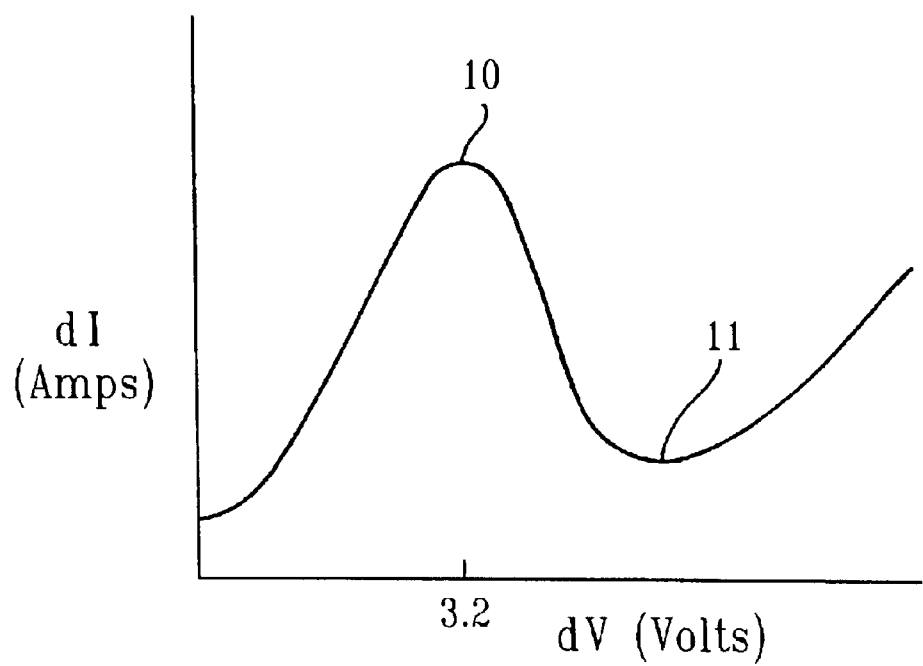
FIG. 3 is a graph depicting negative differential resistance (dI vs. dV) characteristics of the photodiode of the present invention.

The NDR characteristic of the present photodiode under light illumination, e.g., mercury vapor lamp or W lamp illumination, and under negative N+ polysilicon bias at room temperature is shown in FIGS. 2 and 3 of the present application. As illustrated in FIG. 2, a graphical plot 9 of current density, $A/cm^2$, (I), versus absolute N+ polysilicon voltage (V), (not to scale), shows a NDR region at about 3.2 V, for both positive and negative gate bias polarities and dark current-voltage at room temperature. It is noted that the two different I–V curves shown in FIG. 2 are due to two different light intensities. Higher light intensities typically provide more NDR.

It should be noted that the voltage reported above varies with different SiN/reoxidized nitride thicknesses and that the NDR region is exhibited at room temperature. Furthermore, the NDR of the invention photodiode may be enhanced by increasing the illumination intensity.

Similarly, a graphical plot 10 of the rate of change of current (I) versus voltage (V), as illustrated in FIG. 3, shows an NDR peak 10 and valley 11. In the inventive photodiode, no NDR region is observed for a positive N+ polysilicon bias and the current increases with increasing photo-illumination intensity under gate injection. Furthermore, the current is independent, or even slightly decreases, with increasing photo-illumination intensity under positive gate injection.

It should be noted that the above techniques and ranges are exemplary and that other techniques and ranges which are well known to those skilled in the art can also be employed in fabricating the inventive photodiode.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method of fabricating a photodiode comprising the steps of:
   (a) forming a silicon nitride layer in contact with an N+ silicon substrate;
   (b) forming an oxidized silicon nitride layer in contact with said silicon nitride layer,
   (c) forming a layer of N+ polysilicon in contact with at least a portion of said oxidized silicon nitride layer so as to form a photodiode, and
   (d) biasing said N+ silicon substrate positively with respect to said N+ polysilicon layer and exposing said photodiode to illumination, wherein said photodiode exhibits a negative differential resistance region.

2. The method of claim 1, wherein said N+ silicon substrate is doped utilizing an N-type dopant.

3. The method of claim 2, wherein said N-type dopant is As.

4. The method of claim 1, wherein said N+ silicon substrate is formed by outdiffussion of a N-type dopant from a doped glass layer or by ion implantation.

5. The method of claim 1 wherein a precleaning process is employed prior to forming the silicon nitride layer on said N+ silicon substrate.

6. The method of claim 1 wherein said silicon nitride layer is formed by:
   (i) prebaking said N+ silicon substrate under conditions that are effective in removing any native oxides from said N+ silicon substrate;
   (ii) heating the prebaked N+ silicon substrate under conditions to form a SiN nucleation layer on said N+ silicon substrate; and
   (iii) depositing said silicon nitride layer on said SiN nucleation layer by LPCVD using dischlorosilane and $NH_3$ as reactant gases.

7. The method of claim 1 wherein said oxidized silicon nitride layer is formed by exposing said silicon nitride layer to a wet ambient at a temperature of about 900° C.

8. The method of claim 1, wherein said N+ polysilicon layer is formed by an in-situ doping deposition process or deposition followed by ion implantation.

* * * * *